the following figure shows

United States Patent
Toki (12) United States Patent
(10) Patent No.: US 7,023,885 B1
(45) Date of Patent: Apr. 4, 2006

(54) LASER APPARATUS AND METHOD FOR CONTROLLING THE SAME

(75) Inventor: Tsuyoshi Toki, Musashino (JP)

(73) Assignee: Nikon Corporation, Tokyo (JP)

( * ) Notice: Subject to any disclaimer, the term of this patent is extended or adjusted under 35 U.S.C. 154(b) by 1147 days.

(21) Appl. No.: 09/611,916

(22) Filed: Jul. 7, 2000

(30) Foreign Application Priority Data

Jul. 9, 1999 (JP) ................................. 11-195850
May 16, 2000 (JP) ............................. 2000-142862

(51) Int. Cl.
*H01S 3/10* (2006.01)

(52) U.S. Cl. .......................................... 372/9; 372/30
(58) Field of Classification Search ................... 372/9, 372/30
See application file for complete search history.

(56) References Cited

U.S. PATENT DOCUMENTS

| | | | |
|---|---|---|---|
| 5,010,230 A * | 4/1991 | Uemura ................. | 219/121.62 |
| 5,097,291 A * | 3/1992 | Suzuki ................... | 355/69 |
| 5,191,374 A * | 3/1993 | Hazama et al. ........ | 355/43 |
| 5,383,217 A * | 1/1995 | Uemura ................. | 372/58 |
| 5,473,412 A * | 12/1995 | Ozawa ................... | 355/77 |
| 5,627,627 A * | 5/1997 | Suzuki ................... | 355/68 |
| 5,728,495 A * | 3/1998 | Ozawa ................... | 430/30 |
| 5,914,773 A * | 6/1999 | Kurosawa et al. ..... | 355/53 |
| 6,621,846 B1 * | 9/2003 | Sandstrom et al. .... | 372/57 |

* cited by examiner

*Primary Examiner*—Min Sun Harvey
*Assistant Examiner*—Delma R. Flores-Ruiz
(74) *Attorney, Agent, or Firm*—Synnestvedt & Lechner LLP (57) ABSTRACT

A laser apparatus includes a laser element that emits the laser beam. A detector detects the laser beam emitted from the laser element. A controller controls the laser element such that the laser beam is oscillated subject to multiple conditions, such as the emission frequency and the energy of the laser beam, when the laser element is in a ready state, based on the detection results. In the ready state, the laser beam is not emitted from the apparatus onto a subject. Closely monitoring the oscillated beam in the ready state allows the precise beam desired to be emitted in an operational mode. The apparatus is useful for fabricating semiconductor devices.

16 Claims, 4 Drawing Sheets

LASER APPARATUS AND METHOD FOR CONTROLLING THE SAME

BACKGROUND OF THE INVENTION

The present invention relates to a laser apparatus, which emits a laser beam, and a method for controlling the same, and more particularly, to an exposure apparatus and an exposure method used during a lithography process for fabricating microdevices, such as semiconductor devices, liquid crystal display devices, charge-coupled devices (CCDs), and thin film magnetic heads.

An exposure apparatus is used when fabricating semiconductor devices to transcribe a pattern formed on a reticle (mask) to a wafer (substrate), to which a photosensitive material such as photoresist is applied. There is a demand for such exposure apparatus to have a higher resolution to miniature circuit patterns. To satisfy such demand, an excimer laser apparatus is used a's a light source to lengthen the short waves of the exposure light.

Such excimer laser apparatus performs an adjustment pulse emission in which pulses of laser beam are emitted cyclically or continuously without the operator's command during a ready state, in which the irradiation of a reticle or wafer by a laser beam is stopped. This maintains the gas state (density distribution) in the laser chamber. Further, control data to be needed for the emission of the laser pulse after the ready state, such as the relationship between the applied voltage and the output laser pulse energy, is acquired during the adjustment pulse emission.

The conditions of the adjustment pulse emission during the ready state, that is, the target energy of each pulse, the applying voltage corresponding to the target energy, and the oscillation frequency (emission period), are determined by the excimer laser apparatus itself and substantially maintained constant.

Due to the recent various exposure conditions, the emission conditions of the laser beam during exposure are often changed in a complicated manner. Further, the range of the emission condition changes have become wide.

However, the laser's ready state emission condition may differ greatly from the laser's exposure state emission condition since the emission condition of the laser beam during the ready state does not take into consideration the emission condition for the subsequent exposure.

The excimer laser apparatus is also easily affected by a slight change in the target energy or the oscillation frequency. Thus, when the laser beam emission condition in the ready state differs greatly from that of the exposure state, the laser beam output may become unstable if the laser beam output control during exposure is performed based on control data determined in the ready state. Especially in the beginning of the laser beam emission during exposure, the required laser beam energy and the actual emitted laser beam energy may differ greatly.

SUMMARY OF THE INVENTION

It is an object of the present invention to provide a laser apparatus and a method for controlling the same that stably outputs the desired laser beam from the beginning of the laser beam emission even if the laser beam emission conditions change.

It is another object of the present invention to provide a laser apparatus and a method for controlling the same that accurately recognizes the laser beam emission state under various emission conditions during the ready state of the laser apparatus.

It is a further object of the present invention to provide an exposure apparatus and an exposure method that stably irradiates a substrate, such as a wafer, with the desired laser beam even if the laser beam emission condition changes during exposure.

To achieve the above objects, the present invention provides a laser apparatus. The laser apparatus includes a laser element that emits the laser beam, and a detector that detects the laser beam emitted from the laser element. A controller controls the laser element to emit the laser beam under a plurality of emission conditions in a ready state, and controls the detector to detect the laser beam emitted in the ready state.

Another aspect of the present invention provides an apparatus that exposes a substrate by illuminating a pattern formed on a mask with a laser beam and projecting an image of the pattern on the substrate. The apparatus includes a laser source including a laser element to emit a laser beam, an illumination unit disposed in a path of the laser beam, that guides the laser beam emitted from the laser source to the mask, and a detector, at least part of the detector being disposed in the path of the laser beam, that detects the laser beam emitted from the laser source. A controller is functionally associated with the laser source and the detector and controls the laser source to emit the laser beam under a plurality of emission conditions in a ready state and controls the detector to detect the laser beam emitted from the laser element in the ready state.

A further aspect of the present invention provides a method that exposes a substrate by illuminating a pattern formed on a mask with a laser beam and projects an image of the pattern on the substrate. The method includes emitting the laser beam under a plurality of emission conditions during a ready state in which illumination of the mask with the laser beam is prevented, detecting the emitted laser beam in the ready state, and adjusting the emission of the laser beam to be illuminated on the mask based on the detection result.

A further aspect of the present invention provides a laser apparatus that emits a laser beam to an external device. The laser apparatus includes a laser element that emits the laser beam, and a laser controller that receives information from the external device and controls the emission of the laser beam from the laser element. The controller determines an emission condition of the laser beam during a ready state, in which the external device does not use the laser beam, based on the information.

A further aspect of the present invention provides an exposure apparatus that exposes a substrate by irradiating the substrate with a laser beam. The exposure apparatus includes a laser apparatus including a laser element to emit the laser beam and a laser controller to control the emission of the laser beam, and a beam directing system disposed in a path of the laser beam that directs the laser beam emitted from the laser element to the substrate. An exposure controller connected to the laser controller, that provides the laser controller information for determining an emission condition of the laser beam during a ready state in which the laser beam emitted from the laser element is not guided outside of the laser apparatus.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

An exposure apparatus for fabricating semiconductor devices according to a first embodiment of the present invention will now be described with reference to FIGS. 1 to 3.

Figure 1:
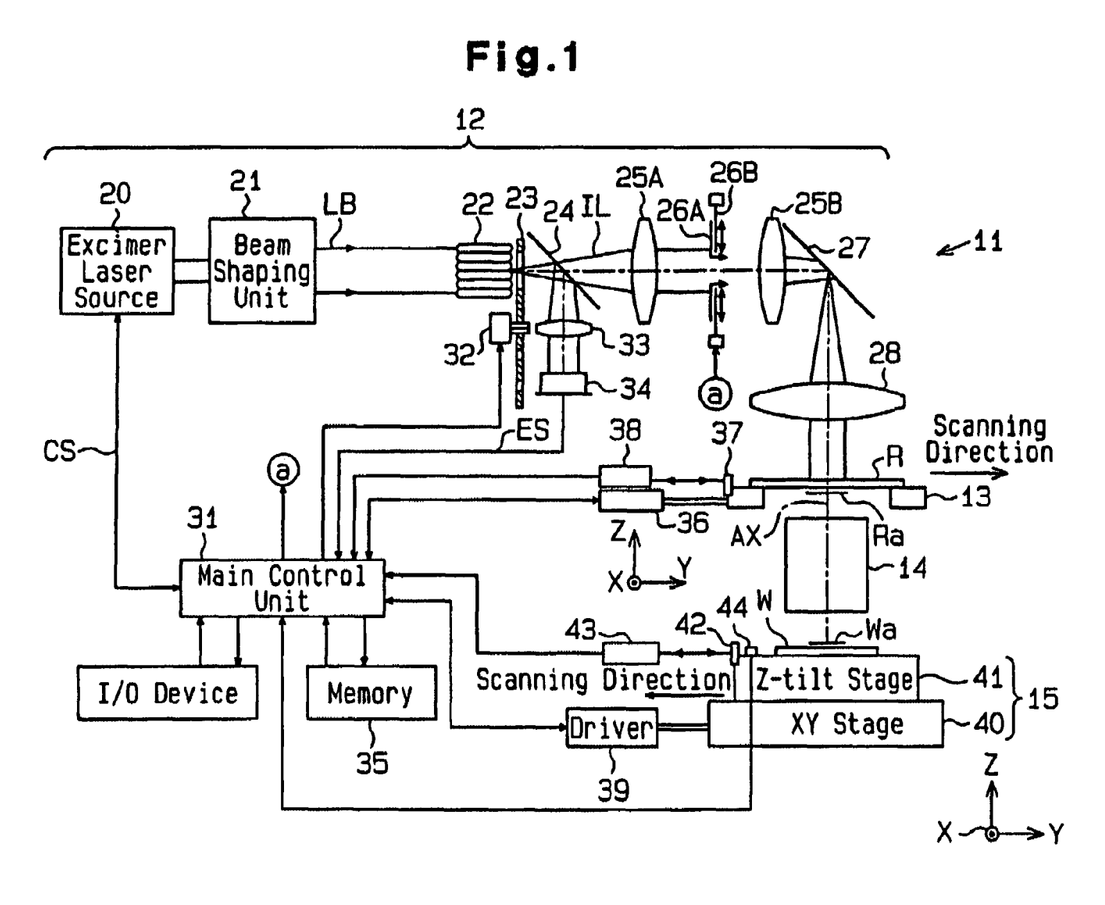
FIG. 1 is a schematic diagram showing an exposure apparatus according to first to third embodiments of the present invention.

FIG. 1 is a schematic view showing an exposure apparatus 11 of the first embodiment. The exposure apparatus 11 is a step-and-scan scanning exposure apparatus that employs an excimer laser, or pulse light source, as an exposure light source.

The exposure apparatus 11 includes an illumination system 12, a reticle stage 13, which holds a reticle R illuminated by the illumination system 12 and moves in a predetermined scanning direction, a projection system 14 for projecting a pattern image, which is formed on the reticle R, to a wafer W, which serves as a substrate, a wafer stage 15, which holds the wafer W and changes the relative position between the wafer W and the projection system 14, and a controller for controlling each of these sections.

The illumination system 12 includes an excimer laser source 20, a beam shaping unit 21, a fly eye lens 22, a diaphragm 23, a beam splitter 24, a first relay lens 25A, a second relay lens 25B, a fixed reticle blind 26A, a movable reticle blind 26B, a mirror 27, and a condenser lens 28.

An XeCl excimer laser source (oscillation wavelength, 308 nm), a KrF excimer laser source (oscillation wavelength 248 nm), an ArF excimer laser source (oscillation wavelength 193 nm), or an $F_2$ excimer laser source (oscillation wavelength 157 nm) may be used as the excimer laser source 20.

The beam shaping unit 21 comprises, for example, a cylinder lens or a beam expander, and shapes the cross-section of a laser beam LB emitted from the excimer laser source 20 so that the laser beam LB efficiently enters the fly eye lens 22. The fly eye lens 22 functions as an optical integrator that makes the intensity distribution of the laser beam LB emitted by the excimer laser source 20 uniform. The laser beam LB emitted from the fly eye lens 22 will hereafter be referred to as a pulse illumination light IL.

The diaphragm 23 is a disk-like member and arranged near an exit plane of the fly eye lens 22, which is substantially conjugated with a pupil plane of the projection system 14. In addition to, for example, a normal circular opening, a small circular opening for a small a illumination, an opening for annular illumination, and an opening located at positions spaced from the optical axis of the pulse illumination light IL for oblique incidence illumination are formed at equal angular intervals.

The diaphragm 23 is rotated by a driver 32, such as a motor controlled by a main control unit 31 (described later). This selectively arranges one of openings of the diaphragm 23 in the path of the pulse illumination light IL in accordance with the pattern on the reticle R, such as a cyclic pattern or an isolation pattern, and changes the illumination conditions. That is, the diaphragm 23 changes the intensity distribution of the pulse illumination light IL on the plane that is substantially conjugated with the pupil plane of the projection system 14 and alters the illumination conditions of the reticle R.

The beam splitter 24 has a high transmittance and a low reflectance to reflect some of the pulse illumination light IL that exits the fly eye lens 22, which serves as the optical integrator.

The fixed reticle blind 26A and the movable reticle blind 26B are provided between the first relay lens 25A and the second relay lens 25B. The fixed reticle blind 26A is arranged on a plane slightly defocused from a plane conjugate with the pattern surface of the reticle R and has a rectangular opening for regulating an illumination area Ra on the reticle R. The movable reticle blind 26B is arranged near the fixed reticle blind 26A and has an opening of which the position in the scanning direction and the width are variable.

The mirror 27 bends the optical path of the pulse illumination light IL that passes through the second relay lens 25B so that the illumination area Ra on the reticle R is illuminated by the pulse illumination light IL via the condenser lens 28.

The operation of the illumination system 12 will now be described. The laser beam LB emitted from the excimer laser source 20 enters the beam shaping unit 21. The beam shaping unit 21 shapes the cross-section of the laser beam LB so that the laser beam efficiently enters the downstream fly eye lens 22. The laser beam LB then enters the fly eye lens 22. This forms a large number of secondary light sources at the exit side of the fly eye lens 22. The pulse illumination light IL, exits the secondary light sources, passes through one of the openings in the diaphragm 23, and then reaches the beam splitter 24.

The pulse illumination light IL transmitted through the beam splitter 24 proceeds through the first relay lens 25A and passes through the rectangular opening of the fixed reticle blind 26A and the movable reticle blind 26B. The pulse illumination light IL passes through the second relay lens 25B. The optical path of the pulse illumination light IL is then bent vertically downward by the mirror 27. The pulse illumination light IL is transmitted through the condenser lens 28 and guided to the rectangular illumination area Ra to illuminate the reticle R held on the reticle stage 13.

The pulse illumination light IL reflected by the beam splitter 24 is received by an integrator sensor 34, which is formed by a photoelectric transfer device, via a condensing lens 33. The photoelectric transfer signal output by the integrator sensor 34 is provided via a peak hold circuit and an A/D converter (neither shown) to the main control unit 31 (described later) for each pulse as an irradiation energy signal ES.

The integrator sensor 34 may be, for example, a PIN photodiode having sensitivity outside the far ultraviolet band and a high response frequency for detecting the pulses from the excimer laser source 20. The correlation coefficient between the irradiation signal ES from the integrator sensor 34 and the energy (exposure amount) of the pulse illumination light IL on the surface of the wafer W is predetermined and stored in a memory 35 of the main control unit 31.

The reticle R is placed on a reticle stage 13 and adhered to the reticle stage 13 with a vacuum chuck or the like (not shown). A reticle stage driver 36 enables the reticle stage 13 to be scanned within a predetermined stroke along a horizontal plane (XY plane) in the scanning direction (in the Y axis direction, or the lateral direction of the plane of FIG. 1). The position of the reticle stage 13 during scanning is measured by a laser interferometer 38 via a mirror 37 provided on the reticle stage 13. The value measured by the laser interferometer 38 is supplied to the main control unit 31.

The projection system 14 comprises a plurality of coaxial lens elements extending in the Z axis direction along optical axis AX. The lens elements are optically arranged so that both sides of the projection system 14 are telecentric. The projection system 14 has a projection magnification $\alpha$ ($\alpha$ being, for example, ¼ or ⅕). Thus, when the illumination area Ra on the reticle R is irradiated by the pulse illumination light IL as described above, the pattern of the reticle R is projected to a slit-like exposure area Wa on the wafer W, to which resist (photosensitive material) is applied, as an image reduced by the projection system 14 in accordance with the projection magnification $\alpha$. This exposes the wafer W within the exposure area Wa.

The wafer stage 15 includes an XY stage 40, which is driven by a wafer stage driver 39, and a Z tilt stage 41. The XY stage 40 is movable in two dimensions, the Y axis direction, which is the scanning direction (the horizontal direction as viewed in FIG. 1), and the X axis direction which is perpendicular to the scanning direction (the direction perpendicular to the plane of FIG. 1).

The Z tilt stage 41, which is installed on the XY stage 40, is movable in the Z axis direction (the vertical direction as viewed in FIG. 1) and inclinable relative to the optical axis AX of the projection system 14. A wafer holder (not shown) holds the wafer W on the Z tilt stage 41 by means of vacuum suction, or the like. The Z tilt stage 41 adjusts the position of the wafer W in the Z axis (focal position) and the inclination angle of the wafer W relative to the optical axis AX of the projection system 14. Further, a laser interferometer 43 detects the position of the wafer stage 15 with a mirror 42 provided to the Z tilt stage 41. The value measured by the laser interferometer 43 is supplied to the main control unit 31.

A sensor 44 is arranged on the Z tilt stage 41 and positioned along the optical axis AX of the projection system 14 by the movement of the XY stage 40. When the sensor 44 is arranged on the optical axis AX of the projection system 14, the sensor 44 detects the illuminance distribution of the pulse illumination light IL that reaches the image surface of the projection system 14. The illuminance distribution of the pulse illumination light IL detected by the sensor 44 is input to the main control unit 31. The detection result of the sensor 44 and the detection result of the integrator sensor 34 are compared to obtain the illuminance distribution.

The main control unit 31 has a microcomputer (or minicomputer), which includes a central processing unit (CPU), a read only memory (ROM), and a random access memory (RAM). To ensure that the exposure operation is performed accurately, the main control unit 31 substantially exclusively controls, for example, synchronous scanning of the reticle R and the wafer W, the stepping and exposure timing of the wafer W, and the emission conditions (or emission conditions) of the excimer laser source 20 during scanning exposure.

More specifically, the main control unit 31, for example, during scanning exposure, controls the position and velocity of the reticle stage 13 and the XY stage 40 with the respective reticle stage driver 36 and the wafer stage driver 39 based on the detected values of the laser interferometers 38, 43.

Further, the main control unit 31 sets the irradiation timing and the irradiation power (the energy of the laser beam LB) of the excimer laser source 20 by providing control information CS to the excimer laser source 20.

The main control unit 31 also controls the diaphragm 23 with the driver 32 and controls the opening and closing of the movable reticle blind 26B in synchronism with stage-related operation information.

The internal structure of the excimer laser source 20 of the exposure apparatus 11 according to the present embodiment will now be described.

Figure 2:
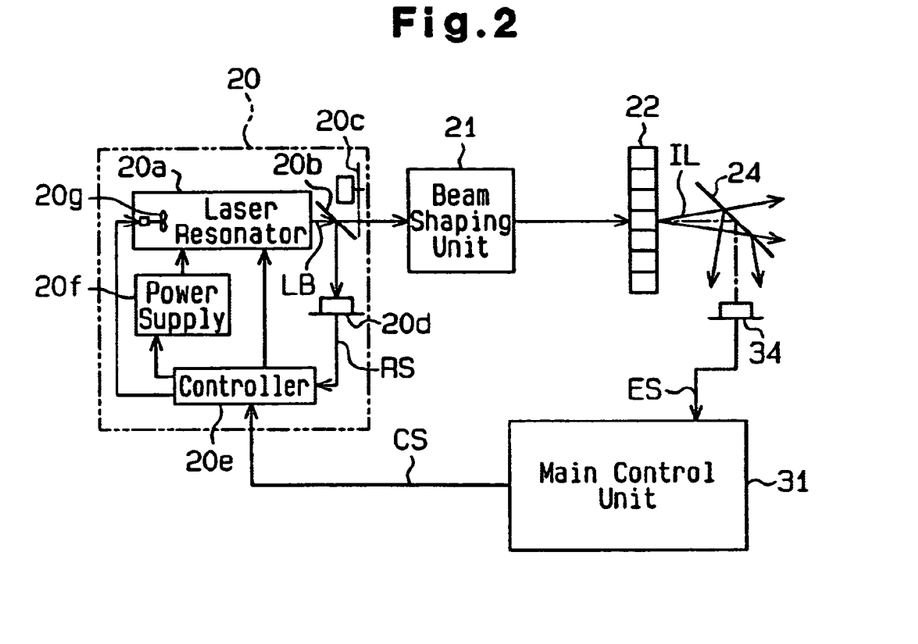
FIG. 2 is a schematic block diagram of an excimer laser source of FIG. 1.

As shown in FIG. 2, the excimer laser source 20 includes a laser resonator 20a, a beam splitter 20b, a shutter 20c, an energy monitor 20d, a controller 20e, and a high voltage power supply 20f. A plurality of gases are sealed in the laser resonator 20a. A pair of electrodes (not shown) for emitting the laser beam LB and a fan 20g are provided in the laser resonator 20a. The high voltage power supply 20f applies a predetermined voltage to the pair of electrodes in the laser resonator 20a under the control of the controller 20e, which serves as a control means. This causes a discharge between the pair of electrodes and emits the laser beam LB.

The shutter 20c is opened and closed in accordance with the control information sent from the main control unit 31. That is, during the ready state, in which the irradiation of the reticle R with the laser beam LB is stopped, the shutter 20c is closed and the emission of the laser beam LB from the excimer laser source 20 to the beam shaping unit 21 is blocked. During the irradiation state, in which the reticle R is irradiated with the laser beam LB, the shutter 20c is opened and the laser beam LB is emitted from the excimer laser source 20 to the beam shaping unit 21.

Under the control of the controller 20e, the fan 20g is rotated to circulate the gas sealed in the laser resonator 20a. This stably provides excited gas between the electrodes even if pulse emission is performed continuously.

If pulse emission does not occur (voltage not being applied to the electrodes) for a long period of time, the controller 20e stops the rotation of the fan 20g. The shaft of the fan 20g extends through a chamber hermetically containing gases, which inhibits deterioration of the gases in the hermetic state caused by unnecessary rotation of the fan 20g.

The controller 20e controls the rotating speed of the fan 20g (the circulating speed of the gases in the laser resonator 20a) in accordance with the pulse emission cycle (oscillation frequency) of the laser beam LB of the laser resonator 20a. For example, if the interval between pulse emissions is relatively long, the rotating speed of the fan 20g is decreased since excited gases may be stably provided between the electrodes even if the circulating speed of the gases is slow. Further, if the pulse emission interval is relatively short, the rotating speed of the fan 20g is increased to increase the circulating speed of the gases. In this manner, the circulation of the gases in the laser resonator 20a is easily adjusted by changing the rotating speed of the fan 20g.

The controller 20e also changes the gas pressure in the laser resonator 20a. Data indicating the relationship between the gas pressure change in the laser resonator 20a and the characteristic (e.g., energy) of the laser beam LB emitted from the laser resonator 20a may be stored beforehand. The data may be used to adjust the gas pressure in the laser resonator 20a during an irradiation state, such as when the wafer W undergoes exposure, in order to change the characteristic of the laser beam LB.

In FIG. 2, the laser beam LB, which is discharged in a pulse-like manner from the laser resonator 20a, enters the beam splitter 20b, which has a high transmittance and a low reflectance. The laser beam LB transmitted through the beam splitter 20b is emitted outside of the excimer laser source 20 when the shutter 20c is opened.

The laser beam LB reflected by the beam splitter 20b enters the energy monitor 20d, which functions as a detection means and is formed by a photoelectric transfer device. The photoelectric transfer signal of the energy monitor 20d is provided to the controller 20e as an emission energy signal RS every pulse via a peak hold circuit (not shown).

Just before entering the normal irradiation state, in which the reticle R is irradiated with the laser beam LB, the controller 20e sets the voltage supplied to the laser resonator 20a from the high voltage power supply 20f so that the energy of the laser beam LB corresponds to an energy per pulse target value, which is included in the control information CS.

The controller 20e also changes the oscillation frequency (emission period) of the laser resonator 20a based on the control information CS.

More specifically, in accordance with the control information CS from the main control unit 31, the controller 20e sets the oscillation frequency of the excimer laser source 20 to the frequency designated by the main control unit 31. Further, the controller 20e designates the voltage supplied by the high voltage power supply 20f so that the energy per pulse at the excimer laser source 20 becomes equal to a value designated by the main control unit 31.

Further, during an irradiation state in which the reticle R is irradiated with the laser beam LB to perform scanning exposure, some of the laser beam LB reflected by the beam splitter 24 enters the integrator sensor 34. Based on the information related to the irradiation energy of every pulse that is provided from the integrator sensor 34 via the main control unit 31, the controller 20e controls the voltage supplied to the laser resonator 20a from the high voltage power supply 20f for every pulse emission during the scanning exposure. During the scanning exposure, the energy monitor 20d in the excimer laser source 20 detects some of the laser beam LB via the beam splitter 20b and monitors changes in the performance of the laser resonator 20a.

During the ready state, the controller 20e causes the laser resonator 20a to emit the laser beam LB under a plurality of emission conditions with the shutter 20c in a closed state. The controller 20e then detects the emitted laser beam LB with the energy monitor 20d.

Figure 3:
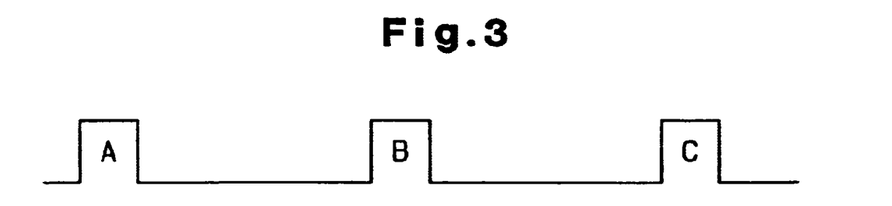
FIG. 3 is a chart showing an oscillation pattern of the laser beam in a ready state.

In this case, with reference to FIG. 3, the laser resonator 20a is controlled so that emission of the laser beam LB, which has a predetermined number of pulses (e.g., several tens of pulses to several hundreds of pulses), and non-emission of the laser beam LB over a predetermined time period (e.g., several seconds to several hundreds of seconds) are alternately repeated. Further, during each of bursts A, B, C, in which a group of emissions are performed intermittently, laser oscillation is performed by, for example, as shown in Table 1 and Table 2, changing the set energy value (target energy) of the laser beam LB or the oscillation frequency (emission cycle) as the emission conditions.

TABLE 1

| Burst | A | B | C | D | ... | A | B | ... |
|---|---|---|---|---|---|---|---|---|
| Set Energy Value (mJ) | 5 | 6 | 7 | 8 | ... | 5 | 6 | ... |
| Oscillation Frequency (kHz) | 1 | 1 | 1 | 1 | ... | 1 | 1 | ... |

TABLE 2

| Burst | A | B | C | D | ... | A | B | ... |
|---|---|---|---|---|---|---|---|---|
| Set Energy Value (mJ) | 10 | 10 | 10 | 10 | ... | 10 | 10 | ... |
| Oscillation Frequency (kHz) | 0.8 | 0.9 | 1.0 | 1.1 | ... | 0.8 | 0.9 | ... |

The controller 20e obtains control data for outputting the laser beam LB for each emission based on the detection result of the energy monitor 20d. The control data indicative of relationship between the set voltage (the voltage applied between the electrodes in the laser resonator 20a) and the target energy (the energy that is to be emitted from the laser resonator 20a) is obtained for each burst, or each emission condition. For each burst A, B, C, . . . , the control data is obtained from when emission starts, at which the energy of the laser beam LB is unstable, to when predetermined n pulses (differs between laser sources, for example, 30 to 100 pulses) are emitted, and stored in a memory section of the controller 20e.

More specifically, if the energy of the first pulse of the laser beam LB detected by the energy monitor 20d in each burst is E1 when the laser resonator 20a is emitted at a certain set voltage V1, the set voltage V1 and the detected energy E1 are stored. The set voltage V1 and the detected energy E1 are compared with a set voltage Vset and a target energy Eset to obtain an energy difference d1. The set voltage V2 of the second pulse is determined based on the difference d1. This adjusts the voltage supplied to the laser resonator 20a from the high voltage power supply 20f.

Then, during emission of the second pulse, the actual set voltage V2 and the detected energy E2 are stored in the same manner as the first pulse. Further, the set voltage V2 and the detected energy E2 are compared with the target set voltage Vset and the target energy Eset to obtain an energy difference d2 and determine the set voltage V3 of the third pulse based on the difference d2. The same learning operation is repeated from the third pulse to the predetermined n pulse, and the actual set voltage Vn and detected energy En are accumulated.

In this manner, the relationship between the voltage (set voltage) applied between the electrodes in the laser resonator 20a and the energy of the laser beam LB detected by the energy monitor 20d are accumulated from the first pulse to the n pulse in each burst. The control data is formed for each emission condition based on the accumulated information.

During actual exposure when the reticle R is irradiated by the laser beam LB to expose the pattern of the reticle R on the wafer W, the controller 20e selects the control data appropriate for the emission condition during exposure from the control data stored for each emission condition.

Further, from the first pulse to the n pulse, the controller 20e controls the irradiation of the reticle R with the laser beam LB by adjusting the voltage supplied to the laser resonator 20a by the high voltage power supply 20f in accordance with the selected control data.

From the n+1 pulse, the voltage applied to the electrodes in the laser resonator 20a is adjusted based on the data of the relationship between the set voltage Vset and the target energy Eset and the energy of at least one pulse of the laser beam LB emitted before the n+1 pulse.

More specifically, if the set voltage Ve for actual exposure and energy Ee is designated from the control information CS of the main control unit 31, the set voltage Ve1 is determined so that the emitted laser beam LB has energy Ee based on the set voltage V1 and the energy E1 of the ready state during emission of the first pulse. The energy E1 of the first pulse of the laser beam LB is detected by the integrator sensor 34.

Then, during emission of the second pulse, the set voltage Ve2 is determined so that the emitted laser beam LB has the energy Ee based on the set voltage and energy E2 of the ready state. From the third pulse to the predetermined n pulse, set voltages Ve3 to Ven are determined so that the emitted laser beam LB has the energy Ee based on the set voltage V3 to Vn and energies E3 to En in the same manner as the second pulse, and the energy of the pulse emitted laser beam LB is sequentially detected by the integrator sensor 34.

Afterward, the target energy of the m pulse of the laser beam LB is determined from the energy Eem−1 of the laser beam LB detected by the integrator sensor 34 during emission of the m−1 pulse, which is the pulse just before the m pulse. Based on the data of the relationship between the set voltage Vset and the target energy Eset, the set voltage Vm for emitting the determined m pulse having the target energy is determined. Subsequently, the set voltage is determined in accordance with a normal algorithm that repeats the same learning operation.

The set voltage Vm need not be determined based on the energy Eem−1 of the laser beam LB of the m−1 pulse. That is, among the previously emitted N pulses (N being an integer of two or greater), the set voltage may be determined from the energy of at least one N pulses of the laser beam LB.

The set voltage Vset and the target energy Eset may be prepared for each of the plurality of emission conditions. Alternately, the set voltage Vset and the target energy Eset may be updated when necessary based on the relationship between the set voltage and the detected energy obtained during the learning operation or the exposure operation.

The first embodiment has the advantages described below.

(a) During the ready state, the exposure apparatus 11 oscillates the laser beam LB by changing the emission condition of the laser resonator 20a of the excimer laser source 20 for each burst, such as the set energy and the oscillation frequency of the laser beam LB. Further, the laser beam LB emitted by the laser resonator 20a is detected by the energy monitor 20d.

Thus, in the ready state, the energy amount of the laser beam LB actually emitted for each emission, and the emission state, such as the applied voltage, during emission may be accurately recognized. Accordingly, the exposure apparatus 11 may easily cope with various emission conditions in the irradiation state, in which the reticle R is irradiated with the laser beam LB.

(b) During the ready state, the exposure apparatus 11 obtains the control data for controlling the output of the laser beam LB for each emission condition based on the laser beam LB detection result of the energy monitor 20d and stores the control data in the memory section of the controller 20e.

Therefore, the control data required for the output control of the laser beam LB, such as the energy amount of the actually emitted laser beam LB and the applied voltage for each emission, may be obtained for each emission. Accordingly, accurate emission control is performed using the control data of each emission condition during the irradiation state.

(c) In the exposure apparatus 11, the pulse laser beam LB is emitted from the laser resonator 20a. Further, control data for controlling the output of each pulse of the laser beam LB from the beginning of the emission to the n pulse is obtained for each emission condition. That is, the control data for emission initiation, in which the energy of the laser beam LB tends to fluctuate, is obtained beforehand for each emission condition, and accurate emission control of the laser beam LB is performed.

(d) In the exposure apparatus 11, during the irradiation state, the voltage supplied to the laser resonator 20a is adjusted based on the control data obtained during the ready state. Therefore, the state of the mixed gases sealed in the laser resonator 20a is quickly shifted to a state in which the laser beam LB having the irradiation energy of the control information CS during the irradiation state is emitted. Accordingly, the irradiation condition of the laser beam LB during the irradiation state is readily stabilized.

(e) During the ready state, the energy or the oscillation frequency of the laser beam LB is changed to alter the emission condition for each burst. In this manner, the learning operation is performed during the ready state, while altering the energy or oscillation frequency of the laser beam LB that are often changed as the irradiation condition of the reticle R. Accordingly, the emission state of the laser beam corresponding to the usage condition of the excimer laser source 20 is accurately recognized.

(f) During the ready state, the exposure apparatus 11 closes the shutter 20c in the excimer laser source 20 and prevents the laser beam LB emitted by the laser resonator 20a from being emitted from the excimer laser source 20. Therefore, during the ready state, the laser beam LB does not enter optical systems and sensors, such as the integrator sensor 34, downstream of the beam shaping unit 21. This inhibits changes in the optical systems and sensors.

Second Embodiment

A second embodiment according to the present invention will now be described. Description will center on parts differing from the first embodiment.

With reference to FIGS. 1 and 2, in the second embodiment, the fixed reticle blind 26A and the movable reticle blind 26B are closed during the ready state. The shutter 20c in the excimer laser source 20 is left open. In this state, the same laser beam LB as the first embodiment is emitted from the laser resonator 20a of the excimer laser source 20. The oscillated laser beam LB is detected by the integrator sensor 34 via the beam shaping unit 21, the fly eye lens 22, the diaphragm 23, the beam splitter 24, and the condensing lens 33.

The energy of each pulse detected by the integrator sensor 34 is fed back to the controller 20e of the excimer laser source 20 through the main control unit 31. In the same manner as the first embodiment, the energy information of each pulse is stored in the memory section of the controller 20e together with the set voltage during emission of the pulses.

In addition to advantages (a) to (f) of the first embodiment, the second embodiment has the advantage described below.

(g) During the ready state, the exposure apparatus 11 detects the laser beam LB emitted by the laser resonator 20a of the excimer laser source 20 near the reticle R with the integrator sensor 34. Therefore, during the ready state, the affects of the beam shaping unit 21, the fly eye lens 22, and the diaphragm 23 are taken into consideration when the emission state of the laser beam LB is recognized. Accordingly, the emission of the laser beam LB during the irradiation state is controlled with further accuracy.

Third Embodiment

A third embodiment according to the present invention will now be described. Description will center on parts differing from the second embodiment.

In the third embodiment, the sensor 44 arranged on the Z tilt stage functions as a detection means. During the ready state, the sensor 44 is located on the optical axis AX of the projection system 14. In this state, the laser beam LB emitted by the laser resonator 20a is detected by the sensor 44 via all of the optical devices included between the excimer laser source 20 and the image plane of the projection system 14, that is, the beam shaping unit 21, the fly eye lens 22, the diaphragm 23, the beam splitter 24, the relay lens 25A, 25B, the mirror 27, the condenser lens 28, and the projection system 14.

The energy of each pulse detected by the sensor 44 is fed back to the controller 20e by the main control unit 31. The energy information of each pulse is stored in the memory section of the controller 20e together with the set voltage during emission of the pulses.

In addition to advantages (a) to (f) of the first embodiment, the third embodiment has the advantage described below.

(h) In the ready state, the exposure apparatus 11 detects the laser beam LB emitted by the laser resonator 20a with the sensor 44 at a position located very closely to the position of the wafer W. Therefore, in the ready state, the oscillation state of the laser beam LB is recognized in substantially the same state as when the pattern of the reticle is transcribed and exposed. Accordingly, the emission of the laser beam LB is controlled with further accuracy during the irradiation state.

MODIFIED EXAMPLES

In each of the above embodiments, during the ready state, the energy of the laser beam LB or the oscillation frequency is changed. However, both energy and oscillation frequency may be changed to alter the emission condition of the laser beam LB. This enables finer response to the emission conditions of the laser beam LB required in the irradiation state and more accurate emission control of the laser beam LB.

The rotating speed of the fan 20g (the gas circulating velocity in the laser resonator 20a) may be changed for each burst. Further, the pressure of the gases in the laser resonator 20a may be varied. This quickly shifts the state of the mixed gases sealed in the laser resonator 20a to a state in which the laser beam LB having the irradiation energy of the control information CS during the irradiation state is emitted. Accordingly, the irradiation conditions of the laser beam LB during the irradiation state is quickly stabilized. Further, the learning operation is performed in the ready state while varying the circulating speed or pressure of the gases in the laser resonator 20, which are variable reticle R illumination conditions. Accordingly, the oscillation state of the laser beam LB corresponding to the usage condition of the excimer laser source is accurately recognized.

It is only necessary that when a plurality of control parameters of the pulse emission of the laser beam LB is prepared, at least one of the control parameters (set energy, oscillation frequency, gas circulating speed, gas pressure, etc.) be varied for each burst to obtain the control data optimal for the emission condition required during the irradiation state.

In each of the above embodiments, the set voltage Ven up to the n pulse in the irradiation state is determined based on the set voltage and the energy En of that pulse in the ready state. Alternatively, the second pulse set voltages Ve2 to the nth pulse set voltage Ven may be determined based on the relationship between the energies Ee1 to Een−1 of the first to n−1 pulses, which are the pulses immediately before the respective second to n pulses, and from the relationship between the set voltage Vn and the detected energy En of the subject pulse obtained during the ready state.

In the third embodiment, the laser beam LB is detected by the sensor 44 arranged on the Z tilt stage 41. Alternatively, the laser beam LB may be detected by an irradiation amount monitor (not shown) arranged on the Z tilt stage 41.

In each of the above embodiments, a pulse light is used as the laser beam LB. However, a continuous gas laser beam of, for example, He—Ne or carbonic acid gas may be used.

In each of the above embodiments, the present invention is applied to a scan type exposure apparatus for fabricating semiconductors. However, the present invention may also be applied to, for example, a liquid crystal display device, an imaging device, a microdevice, such as a thin film magnetic head, and a mask, such as a reticle or a photomask. Further, the present invention may be applied to an exposure apparatus that transcribes and exposes a non-magnified or magnified pattern of a mask, such as the reticle R or a photomask onto a substrate (e.g., the wafer W or the glass plate). Further, the present invention may be applied to a static exposure apparatus, which transcribes and exposes the pattern of the reticle R on the wafer W using the step-and-repeat process.

In each of the above embodiments, the present invention is applied to the excimer laser source 20 of the exposure apparatus. However, the present invention may also be applied to, for example, a laser cutting machine, a laser measuring device, and a laser information reading device.

In the above embodiments, the emission conditions of the laser beam during the ready state of the laser apparatus are easily changed.

In the above embodiments, the control data for controlling the laser beam output for each emission condition is obtained from the detection result of the laser beam during the ready state.

In the above embodiments, the control data for controlling the laser beam output for each emission condition is obtained with further accuracy, especially during the initiation of emission, when the emission condition has a tendency to change.

In the above embodiments, the voltage supplied to the resonator is adjusted based on the control data obtained during the ready state of the laser apparatus. This shifts the state of the gas in the resonator to a state in which the required irradiation amount can be readily obtained.

In the above embodiments, the emission condition is varied during the ready state by changing at least one of either the energy of the laser beam and the oscillation frequency. This recognizes the emission condition corresponding to the usage condition of the laser apparatus.

In the above embodiments, the gas circulating speed in the resonator is adjusted during the actual laser beam irradiation state in accordance with the control data obtained in the ready state. This shifts the gases in the resonator to a state in which the required irradiation amount is readily emitted.

In the above embodiments, the circulation of the gases in the resonator is easily adjusted by changing the rotating speed of the fan in the resonator.

In the above embodiments, when an irradiation subject is actually irradiated with the laser beam, the speed of the fan and the state of the gases in the resonator is quickly shifted to a state in which the required energy amount is obtained based on the control data of the ready state.

Figure 4:
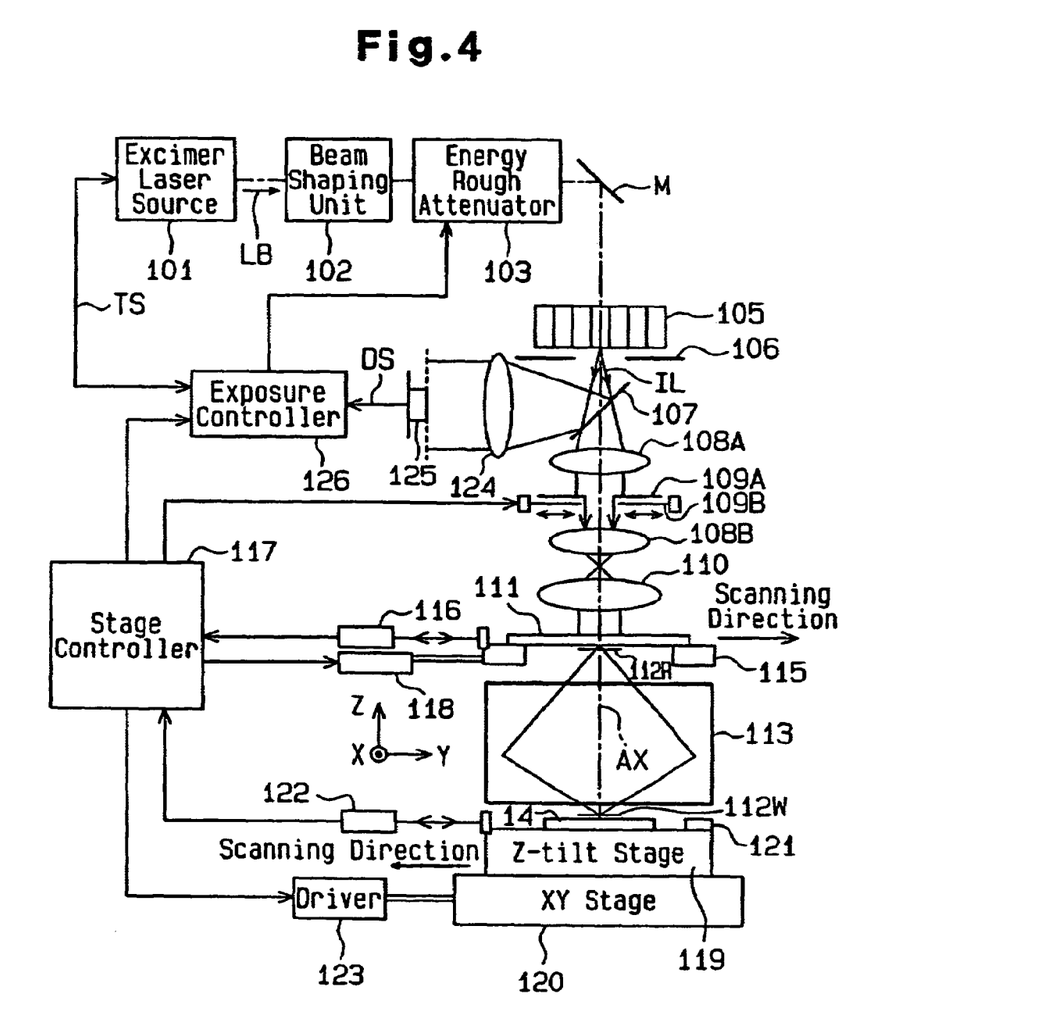
FIG. 4 is a schematic diagram showing a step-and-scan projection exposure apparatus according to a fourth embodiment of the present invention.

A fourth embodiment according to the present invention will now be described with reference to the drawings. In this embodiment, the present invention is applied to a step-and-scan projection exposure apparatus, which uses an excimer laser beam apparatus as a pulse energy source.

The projection exposure apparatus of this embodiment is shown in FIG. 4. As shown in FIG. 4, a laser beam LB pulse-emitted from an excimer laser source 101 has a cross-sectional shape formed by a beam shaping unit 102, which includes a cylinder lens and a beam expander, so that the laser beam LB efficiently enters a downstream fly eye lens 105. An excimer laser source 101 is preferably KrF (wavelength 248 nm) or ArF (wavelength 193 nm) excimer laser source.

The present invention may also be applied when an $F_2$ (wavelength, 157 nm) laser source, a metal vapor laser source, or a pulse light source of a YAG laser high frequency generator is employed as the pulse light source.

The laser beam LB emitted from the beam shaping unit 102 enters an energy rough attenuator 103, which functions as an energy adjustor. The energy rough attenuator 103 is formed by arranging a plurality of ND filters, each having a different transmittance (1—extinction rate), on a rotatable revolver. The rotation of the revolver shifts the transmittance of the entering laser beam between a plurality of levels starting from 100%.

The laser beam LB emitted from the energy rough attenuator 103 enters the fly eye lens 105 via a mirror M, which bends the optical path. The fly eye lens 105 forms a plurality of secondary light sources for irradiating a reticle (described later) with uniform illuminance distribution. The fly eye lens 105 has an exit plane at which an illumination system diaphragm (the so-called σ diaphragm) 106 is arranged. The laser beam emitted from the secondary light source in the diaphragm 106 (hereafter referred to an pulse illumination light IL) enters a beam splitter 107, which has a low reflectance and a high transmittance. The pulse illumination light IL, which functions as an exposure beam, transmitted through the beam splitter 107 passes through a rectangular opening of a fixed diaphragm (fixed reticle blind) 109A via a first relay lens 108A. The fixed diaphragm 109A is arranged in the vicinity of a plane conjugated with a pattern plane of the reticle. A movable diaphragm 109B is arranged near the fixed diaphragm 109B and has an opening of which the position in the scanning direction and the width are variable. The movable diaphragm 109B has blades arranged in the scanning direction to further restrict the illumination area during initiation and termination of scanning exposure and prevent unnecessary exposure.

The pulse illumination light IL that passes through the fixed diaphragm 109A and the movable diaphragm 109B is further transmitted through a second relay lens 108B and a condenser lens 110 and irradiates a rectangular illumination area 112R on the reticle 111, which is held on a reticle state 115, with uniform illuminance distribution. An image, which is obtained by reducing the pattern of the illumination area 112R on the reticle 111 by a projection magnification α (α being, for example ¼ or ⅕) with a projector 113, is projected to a rectangular exposure area (illumination field) 112W defined on a wafer 114, on which a photoresist is applied. The wafer 114 is exposed within the exposure area 112W. The wafer 114 is, for example, a silicon or silicon on insulator (SOI) wafer.

In the following description, Z axis will be referred to as an axis parallel to an optical axis AX of the projector 113, and Y axis will be referred to as an axis parallel to a plane perpendicular to the optical axis AX and the scanning direction of the illumination area 112R on the reticle 111. The axis parallel to a non-scanning direction, which is perpendicular to the scanning direction, is referred to as the X axis.

The reticle stage 115 is driven in the Y axis direction by a reticle stage driver 118. An X axis coordinate, a Y axis coordinate, and a rotational angle of the reticle stage 115 are detected by a mirror provided on the reticle stage 115 and a laser interferometer 116 and provided to the stage controller 117. The stage controller 117 controls the position and velocity of the reticle stage 115 with the stage driver 118 in accordance with the coordinates and angle.

The wafer 114 is held on a Z tilt stage 119 by a wafer holder (not shown), and the Z tilt stage 119 is arranged on an XY stage 120. The XY stage 120 positions the wafer 114 in the X axis and Y axis directions 114 and moves (scans) the wafer 114 in the Y axis direction at a constant velocity. The Z tilt stage 119 functions to adjust the position of the wafer 114 in the Z axis (focal position) and the inclination angle of the wafer 114 relative to the XY plane. An X axis coordinate, a Y axis coordinate, and a rotational angle of the XY stage 120 are detected by a mirror provided to the Z tilt stage 119 and a laser interferometer 122 and provided to the stage controller 120. The stage controller 117 controls the position and velocity of the XY stage 120 with a wafer stage driver 123 in accordance with the coordinates and angle.

The operation of the stage controller 117 is controlled by a main control system (not shown), which controls the entire apparatus. When scan exposure is performed, the wafer 114 is scanned in the −Y direction (or the +Y direction) at a velocity α·Vr (α being the magnification of the reticle 111 relative to the wafer 114) by means of the XY stage in synchronism with the illumination area 112R of the reticle 111 scanned in the +Y direction (or the −Y direction) at a velocity $V_R$ by means of the reticle stage 115.

A sensor 121, which is preferably a photoelectric transfer device, is arranged near the wafer 114 on the Z tilt stage 119. The sensor 121 has a light receiving surface which is flush with the surface of the wafer 114. A PIN photodiode having sensitivity outside the far ultraviolet band and a high response frequency for detecting the pulse irradiation may be used. The detection signal of the sensor 121 is provided to an exposure controller 126 via a peak hold circuit and an analog/digital (A/D) converter.

The pulse illumination light IL reflected by the beam splitter 107 is received by an integrator sensor 125, which is preferably a photoelectric transfer device that functions as an energy sensor, via a condenser lens 124. The photoelectric transfer signal of the integrator sensor 125 is provided to the exposure controller 126 as an output DS (digit) via a peak hold circuit and an A/D converter (neither shown).

The correlation coefficient between the output DS of the integrator sensor 125 and the pulse energy (exposure amount) per unit area of the pulse illumination light IL on the surface of the wafer 114 (image plane) is predetermined and stored in the exposure controller 126.

The exposure controller 126 provides control information TS to the excimer laser source 101 via a serial interface or a parallel interface in accordance with stage operation information from the stage controller 117 to control the emission timing (oscillation frequency) and emission power (energy) of the excimer laser source 101. Further, the exposure controller 126 controls transmittance by switching the ND filter of the energy rough attenuator 103. The stage controller 117 controls the opening and closing of the movable diaphragm 109B in accordance with the stage information.

The structure of the exposure amount control system in this embodiment will now be discussed with reference to FIG. 5.

Figure 5:
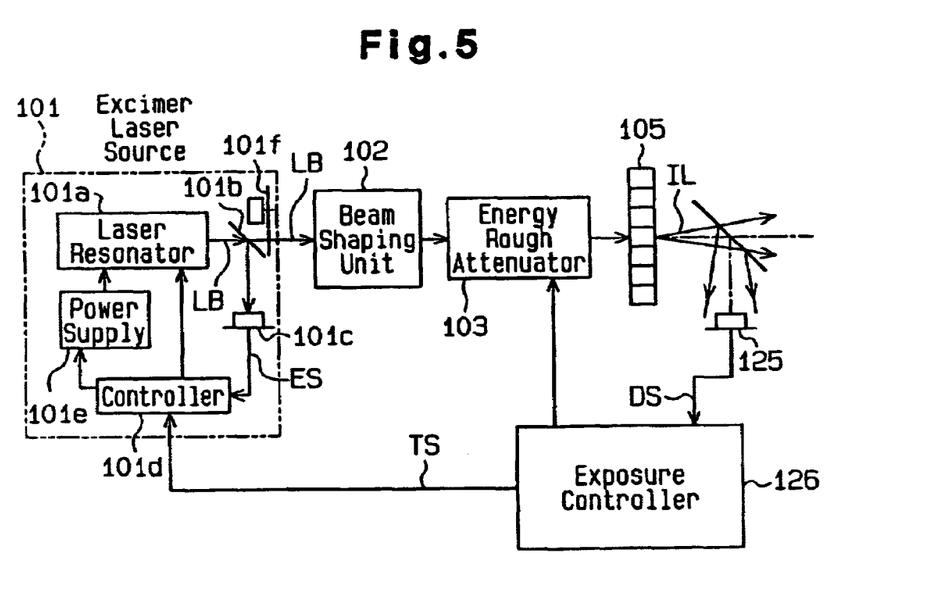
FIG. 5 is a block diagram showing an exposure control system of the projection exposure apparatus of FIG. 4.

FIG. 5 shows the exposure amount control system of the projection exposure apparatus of FIG. 4. In the excimer laser source 101, a laser beam is emitted from a laser resonator 101a in a pulse-like manner. The laser beam enters a beam splitter 101b, which has a high transmittance and a very low reflectance, and is guided to the projection exposure apparatus, which serves as an external device. The laser beam reflected by the beam splitter 101b enters an energy monitor 10c, which is a photoelectric transfer device. The energy monitor 101c then provides a photoelectric transfer signal to a controller 101d as an output ES via a peak holder circuit (not shown). The controller 101d is connected to the exposure controller 126 via a serial interface or a parallel interface. The power supply voltage of a high voltage power supply 101e is set based on the control information TS. This sets the pulse energy of the laser beam LB emitted from the laser resonator 101a in the proximity of a predetermined value.

The average energy per pulse value of the excimer laser source 101 is normally stabilized at a predetermined energy $E_0$ (rated output) and controlled to be within a predetermined variable range about the energy $E_0$ (e.g., approximately +/−10%). In the fourth embodiment, the pulse energy is finely modulated within the variable range. A shutter 101f for blocking the beam path of the laser beam LB in accordance with the control information TS from the exposure controller 126 is arranged at the outer side of the beam splitter 101b in the excimer laser source 101.

Further, a fan (not shown) circulates the gases in the laser resonator 101a. The controller 101d adjusts the rotating speed of the fan in accordance with the pulse emission period (oscillation frequency) of the laser beam LB emitted by the laser resonator 101a.

A temperature sensor and a pressure sensor (neither shown) are also provided in the laser resonator 101a. The controller 101d adjusts the temperature and gas pressure of the laser resonator 101a in accordance with the detection results of the temperature and pressure sensors.

The laser control operation and exposure operation of the present embodiment will now be discussed. The laser control operation performed during exposure is described in detail in Japanese Unexamined Patent Publication No. 2000-21717.

Before processing a lot including a plurality of wafers, an operator determines a target exposure amount $S_0$, which is the target value of the cumulative exposure amount of each point on the wafer 114. The operator also determines a minimum exposure pulse number Nmin of the pulse illumination light IL that must be irradiated at each point of the wafer 114 with predetermined exposure amount control reproduction accuracy.

Based on these parameters, the exposure controller 126 maximizes the transmittance of the energy rough attenuator 103 and causes the excimer laser source 101 to perform the predetermined number of pulse irradiation at, for example, the vicinity of the median energy $E_0$. The integrator sensor 125 detects the pulses emitted from the excimer laser source 101 to obtain the average pulse energy P of the pulses incident on the wafer 114. The exposure controller 126 then obtains the exposure pulse number N (the number of pulses that should be irradiated at each point on the wafer 114 during exposure) by dividing the target value $S_0$ of the cumulative exposure amount with the detected average pulse energy P. Since the division $S_0/P$ result is not necessarily an integer, the division $S_0/P$ is rounded up as will be described later. For simplicity, the division $S_0/P$ result will be described as an integer here.

If the obtained exposure pulse number N is already equal to or greater than Nmin, exposure is initiated. However, if the obtained exposure pulse number N is less than Nmin, the exposure controller 126 selects and sets the ND filter of the energy rough attenuator 103 that has, for example, the highest transmittance that enables the exposure pulse number N to be equal to or greater than Nmin. When the selected transmittance is represented by $T_{ND}$, the exposure number N is represented by $(S_0/(P \cdot T_{ND}))$. Actually, $(S_0/(P \cdot T_{ND}))$ is not necessarily an integer and must thus be rounded up. For the sake of brevity, however, $(S_0/(P \cdot T_{ND}))$ will be described as an integer. As a result, the target energy per pulse Et is $S_0/N$. The exposure controller 126 supplies the target energy Et to the controller 101d of the excimer laser source 101. The controller 101d sets the voltage applied by the high voltage power supply 101e to set the target energy of the laser beam LB for the next pulse emission.

With reference to FIG. 4, when the width of the slit-like exposure area 112W on the wafer 114 (slit width) is represented by $D_W$, the oscillation frequency of the excimer laser source 101 as $F_W$, and the scanning velocity of the wafer 114 during scanning exposure as $V_W$, the wafer 114 moves by a distance of $V_W/F_W$ between pulse irradiations. Thus, the exposure pulse number N may be expressed by equation (1), which is shown below. That is, the slit width $D_W$ and the oscillation frequency $F_W$ must be reset to obtain the exposure pulse number N.

$$N = D_W/(V_W/F_W) \qquad (1)$$

Since the slit width $D_W$ is normally constant, at least either one of the oscillation frequency $F_W$ and the scanning velocity $V_W$ are set to satisfy equation (1). The information of the scanning velocity $V_W$ is provided to the stage controller 117, and the information of the oscillation frequency $F_W$ is provided to the controller 101d of the excimer laser source 101.

Afterward, when performing scanning exposure on the first wafer W, the exposure controller 126 sends an exposure preparation command to the controller 101d and then provides the controller 101d with a trigger signal for irradiation at frequency $F_W$. In accordance with the trigger signal from the exposure controller 126, the laser resonator 101a of the excimer laser source 101 emits a laser beam LB. Further, the exposure controller 126 feeds back the output DS of the integrator sensor 125 directly to the controller 101d of the excimer laser source 101 for each pulse. Based on the output DS of the integrator sensor 125, the controller 101d adjusts the voltage supplied to laser resonator 101a for the subsequent pulse emission. For example, the controller 101*d* controls the voltage of the high voltage power supply 101*e* for the next pulse emission using the prepared control data based on the output DS of the integrator sensor 125 so that the average pulse energy value of the laser beam emitted by the laser resonator 101*a* becomes equal to the target energy Et ($S_0$/N) before the emitted pulse number reaches N. After the emitted pulse number reaches N, the controller 101*d* sequentially controls the voltage of the high voltage power supply 101*e* for the next pulse emission based on the cumulative exposure amount of the series of previous N pulses (movable window). This provides a cumulative exposure amount that achieves the target value $S_0$ with the necessary exposure amount control accuracy at each point on the wafer after the scanning exposure.

During this scanning exposure period, the controller 101*d* detects the output ES of the energy monitor 10*c*, confirms whether the detection result is included within a tolerable range of the target energy Et, and checks whether there is an abnormality in the excimer laser source 101.

After exposure of the first wafer 114 is completed, the exposure controller 126 outputs a ready command (burst-off signal) to the controller 101*d* of the excimer laser source 101. Upon receipt of the ready command, the controller 101*d* of the excimer laser source 101 closes the shutter 101*f* and performs adjustment pulse emission in which the resonator 101*a* emits pulses of laser beam at constant intervals or in a substantially continuous manner to maintain the gas state in the laser resonator 101*a* or obtain the control data (the relationship between the energy of the laser beam output from the laser resonator and the applied voltage) used for the next pulse emission state in which the laser beam LB is to be emitted outside of the excimer laser source 101.

The excimer laser source 101 is not required to enter the ready state to perform the adjustment pulse emission each time the exposure of a wafer is completed. The adjustment pulse emission may be performed after completing the exposure process on a number of wafers.

The conditions of the adjustment pulse emission are set taking into consideration the conditions for the next actual pulse emission performed when the shutter 101*f* is opened (when the laser beam from the excimer laser source 101 is used on the exposure apparatus, that is, during detection of alignment, during detection of the imaging characteristic of the projection system, etc.).

Accordingly, the exposure controller 126 provides the next actual pulse emission condition as the control information TS with the controller 101*d* of the excimer laser source 101 together with the ready command to determine the conditions of the adjustment pulse emission.

In this embodiment, the next actual pulse emission is performed during exposure of the second wafer. Since the exposure condition of the second wafer is the same as that of the first wafer, the exposure controller 126 provides the previously set target energy Et and oscillation frequency $F_W$ with the controller 101*d* of the excimer laser source 101 as information for determining the adjustment pulse emission condition.

Further, in the fourth embodiment, the controller 101*d* of the excimer laser source 101 performs the adjustment pulse emission under the same conditions as that of the next actual pulse emission. That is, the controller 101*d* sets the target energy Et and the oscillation frequency $F_W$ as the condition of the adjustment pulse emission.

The controller 101*d* of the excimer laser source 101 optimizes the rotating speed of the fan in the laser resonator 101*a*, the temperature of the laser resonator 101*a*, the gas pressure of the laser resonator 101*a*, and the pause interval (the pause time of the adjustment pulse emission in the ready state) in the adjustment pulse emission in accordance with the adjustment pulse emission conditions (the target energy Et and the oscillation frequency $F_W$).

When the controller 101*d* of the excimer laser source 101 completes preparation of the adjustment pulse emission, the high voltage power supply 101*e* supplies the laser resonator 101*a* with voltage corresponding to the target energy Et, and the laser resonator 101*a* emits a laser beam LB in accordance with the frequency $F_W$ trigger signal generated in the controller 101*d*. Part of the laser beam LB emitted from the laser resonator 101*a* is reflected by the beam splitter 101*b* toward the energy monitor 10*c*. The energy monitor 101*c* provides the obtained energy information as the output ES to the controller 101*d*. The controller 101*d* determines the control data for the next actual pulse emission based on the adjustment pulse emission condition and the information ES. In addition to the control information of the voltage corresponding to the target energy Et, the control data for the next actual pulse emission includes the rotating speed of the fan in the laser resonator 101*a*, the temperature of the laser resonator 101*a*, and the gas pressure of the laser resonator 101*a*.

When preparation for the exposure of the second wafer is completed, the exposure controller 126 sends an exposure preparation command to the controller 101*d* of the excimer laser source 101. The controller 101*d* then uses the control data determined during the previous ready state and begins the exposure of the second wafer.

In this manner, the adjustment pulse emission condition for the ready state of the excimer laser source 101 is set with the next actual pulse emission taken into consideration. Further, the control data determined during the adjustment pulse emission is used for the next actual pulse emission. Thus, during the next actual pulse emission, a laser beam having the desired energy is stably output from the beginning, and the cumulative exposure amount of the wafer 114 is uniformed with the desired accuracy.

Modified Embodiment

In the fourth embodiment, the controller 101*d* sets the same condition of the adjustment pulse emission as that of the next actual pulse emission. However, the two conditions need not be the same as long as the condition of the adjustment pulse emission is optimized in accordance with the condition of the next actual pulse emission.

Modified Embodiment

In the fourth embodiment, the target energy and the oscillation frequency are provided to the controller 101*d* of the excimer laser source 101 by the exposure controller 126 as the condition of the next actual pulse emission to determine the adjustment pulse emission of the excimer laser source 101. However, instead of both parameters, only one of these parameters may be provided to the controller 101*d*. Other parameters may also be provided to the controller 101*d*.

For example, at least one of the target energy, the oscillation frequency, the pause interval during the actual pulse emission, the exposure pulse number N, and the voltage value immediately after initiation of the pulse emission may be provided to the controller 101*d* of the excimer laser source 101 as the condition for the next actual pulse emission.

The condition of the next actual pulse emission does not necessarily have to be provided before initiating the ready state of the excimer laser source 101. For example, if the condition of the next actual pulse emission is substantially the same as that of the previous actual pulse emission, the condition of the adjustment pulse emission may be set in accordance with the conditions et for the previous actual pulse emission. Further, before processing a lot of wafers, the condition of the adjustment pulse emission which is performed during the processing the lot may be set in accordance with the actual pulse emission conditions et for the exposure of the first wafer of the lot.

In the fourth embodiment, the exposure controller 126 provides the next actual pulse emission condition to the controller 101d of the excimer laser source 101 to determine the adjustment pulse emission condition of the excimer laser source 101. However, the adjustment pulse emission condition may be directly provided to the controller 101d of the excimer laser source 101 by the exposure controller 126. In this case, the input need not be performed when initiating the ready state of the excimer laser source 101.

At least one of the target energy (applied voltage), the oscillation frequency, the pause interval, the rotating speed of the fan in the laser resonator 101a, the temperature of the laser resonator 101a, and the gas pressure of the laser resonator 101a may be provided to the controller 101d of the excimer laser source 101 by the exposure controller 126 as the adjustment pulse emission condition.

In the fourth embodiment, the high voltage power supply 101e adjusts the voltage supplied to the laser resonator 101a in accordance with the output DS of the integrator sensor 125 during scanning exposure. However, the voltage may be adjusted in accordance with the output ES of the energy monitor 101c in the excimer laser source 101.

In the fourth embodiment, the output DS of the integrator sensor 125 may be directly provided to the controller 101d of the excimer laser source 101 without being transmitted through the exposure controller 126.

The exposure apparatus of each of the above embodiments is manufactured by incorporating illumination and projection systems, which are formed from a plurality of lens, in a main body of an exposure apparatus and performing optical adjustment, securing reticle and wafer stages, which are formed by a plurality of mechanical parts, connecting wires and pipes to the main body of the exposure apparatus, and performing entire adjustment (electrical adjustment, operation check, etc.). It is preferred that the manufacture of the exposure apparatus be performed in a clean room in which the temperature and cleanness are managed.

Semiconductor devices are fabricated from wafers on which reticle patterns are transcribed by an exposure apparatus according to the present invention. That is, the semiconductor is fabricated by undergoing the steps of designing the function and capability of the device, producing a reticle based on the designed function and, exposing the reticle pattern on wafers with an exposure apparatus according to the present invention, assembling (dicing, bonding, and packaging) the device, and inspecting the device.

Further, the present invention may be applied to a full-field projection exposure apparatus, such as a stepper.

The laser apparatus according to the present invention stably outputs the desired laser beam from the beginning of the beam emission even if the emission condition of the laser beam changes.

Further, the desired laser beam may stably be irradiated against a substrate even if the usage condition (emission condition) of the laser beam during exposure changes. This uniforms the cumulative exposure amount of the substrate to the desired accuracy. The usage range (energy range or frequency range) of the laser beam during exposure may also be widened. This increases the range of mask illumination conditions and substrate exposure conditions.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A laser apparatus which supplies a laser beam to an exposure device, comprising:
    a laser element that emits pulses of the laser beam, the laser element including a laser resonator;
    a detector that detects the laser beam emitted from the laser beam body; and
    a controller that controls the laser element to emit the laser beam under a plurality of emission conditions in a ready state, and forms plural pieces of control data corresponding to the respective emission conditions based on detection results of the detector, the plurality of emission conditions being different from each other in at least one of an energy of the laser beam and an emission period of the laser beam,
    wherein the controller selects one of the plural pieces of control data for controlling the laser element when the laser beam emitted from the laser element is supplied to the exposure device.

2. The laser apparatus of claim 1, wherein the laser beam is emitted by applying a voltage to the laser element, and the controller adjusts the voltage supplied to the laser element based on the selected control data.

3. The laser apparatus of claim 1, further comprising a circulating device that circulates gas in the laser element, wherein the controller controls the circulating device when the laser beam emitted from the laser element is supplied to the external device.

4. The laser apparatus of claim 3, wherein the circulating device includes a fan for circulating the gas in the laser element, and the controller adjusts the rotating speed of the fan to adjust the circulation of the gas in the laser element.

5. The laser apparatus of claim 3, wherein the emission conditions include a circulating speed of the gas in the laser element, and the emission conditions are changed by changing the circulating speed.

6. The laser apparatus of claim 1, wherein the controller adjusts the pressure of gas in the laser element.

7. The laser apparatus of claim 6, wherein the emission conditions include a pressure of the gas in the laser element, and the emission conditions are changed by changing the pressure.

8. A method of controlling a laser apparatus that supplies a laser beam to an exposure device, comprising:
    emitting pulses of the laser beam under a plurality of emission conditions during a ready state in which the laser beam is not directed to the exposure device, the plurality of emission conditions being different from each other in at least one of an energy of the laser beam and an emission period of the laser beam;
    detecting the emitted laser beam in the ready state;

forming, on the basis of information obtained by detecting the laser beam in the ready state, plural pieces of control data corresponding to the respective emission conditions;

selecting one of the plural pieces of control data; and supplying the laser beam to the exposure device while controlling an emission of the laser beam of the laser apparatus based on the selected control data.

9. A laser apparatus that emits a laser beam to an external device, comprising:

a laser element that emits the laser beam, the laser element including a laser resonator; and a laser controller, connected to the laser element and the external device, that receives information from the external device and controls the emission of the laser beam from the laser element, wherein the controller determines an emission condition of the laser beam based on the information during a ready state, in which the external device does not use the laser beam, and wherein the information includes an emission condition of the laser beam used in an operation which is performed by the external device after the ready state.

10. The laser apparatus of claim 9, wherein the information includes a target energy of the laser beam emitted from the laser element.

11. The laser apparatus of claim 9, wherein the laser element emits pulses of the laser beam with an emission frequency, and the information includes the emission frequency of the laser beam.

12. The laser apparatus of claim 9, wherein the external device includes an exposure device that exposes a substrate by irradiating a mask with the laser beam emitted from the laser element and projecting a pattern image of the mask on the substrate.

13. The laser apparatus of claim 12, wherein the operation of the exposure device includes the exposure of the substrate.

14. The laser apparatus of claim 2, wherein the selected control data includes the relationship between the target energy of the laser beam and the voltage.

15. The laser apparatus of claim 8, wherein the selected control data includes the relationship between a target energy and a voltage supplied to the laser apparatus.

16. The apparatus of claim 9, further comprising a detector which detects the laser beam emitted from the laser element, wherein the laser controller forms control data based on detection results of the detector obtained in the ready state.

* * * * *